United States Patent

[11] 3,573,659

[72] Inventor Michael Dydyk
Long Island City, N.Y.
[21] Appl. No. 800,985
[22] Filed Feb. 20, 1969
[45] Patented Apr. 6, 1971
[73] Assignee Loral Corporation
Bronx, N.Y.

[54] FERRIMAGNETICALLY TUNABLE GUNN OSCILLATOR
4 Claims, 8 Drawing Figs.

[52] U.S. Cl. .................... 331/99, 331/107
[51] Int. Cl. .................... H03b 7/14
[50] Field of Search .................... 331/107 (G), 99; 317/234.10

[56] References Cited
UNITED STATES PATENTS

| | | | |
|---|---|---|---|
| 3,268,838 | 8/1966 | Matthaei .................... | 333/73 |
| 3,336,535 | 8/1967 | Mosher .................... | 331/99X |

OTHER REFERENCES

Electronics, Sept. 30, 1968, pp. 44— 45. (331— 107G)
James, Electronics Letters, 18 Oct. 1968, pp. 451— 452, (331— 107G)

*Primary Examiner*—Roy Lake
*Assistant Examiner*—Siegfried H. Grimm
*Attorney*—Charles E. Temko

ABSTRACT: A very wide frequency tuning (5.8 to 13.0 GHz) Gunn effect oscillator using the properties of a ferrimagnetic resonator sphere as a tuning element.

FERRIMAGNETICALLY TUNABLE GUNN OSCILLATOR

This invention relates generally to the field of tunable microwave local oscillators, of a type used e.g. in superheterodyne receivers, spectrum analyzers and frequency hopping systems, and more particularly to an improved form thereof in which tuning is accomplished electronically.

A continuing need exists for wide-band, solid-state microwave local oscillators, with the development of compact electronic devices. Such oscillators utilizing transistors as the active and varactors as tuning elements have already been thoroughly described in the literature. Because of the nature of the varactor, the tuning curves (frequency vs. voltage) of these oscillators are nonlinear and require tunable discriminator loops of function generators for linearization. The inclusion of a discriminator loop or function generator adds substantially to complexity and weight to a receiver, and, is not an attractive or desirable feature.

In recent years, considerable emphasis has been given to electronically tunable transistor oscillators utilizing a ferrimagnetic resonator as the tuning element. This approach avoids the need for linearization, since the resonant frequency of an isotropic ferrimagnetic resonator is a linear function of the external magnetic field.

The frequency covered by the transistor oscillators operating in the fundamental mode has been P through S bands. To obtain oscillations at higher frequencies, the nonlinear behavior of the collector-base capacitance is used for parametric frequency multiplication. This, of course, has the disadvantage of low output power and the problem of suppressing undesirable signals. To overcome these difficulties, it is appropriate to select an active device that can provide the required output power operating in the fundamental mode. Fortunately, in recent years, two new active devices have been invented i.e. Avalanche and Gunn Diodes, which are able to satisfy the desired requirements. Due to its substantially lower noise content, only the Gunn Diode will be considered in this application.

It is among the principal objects of the present invention to provide an improved ferrimagnetically tunable Gunn oscillator of minimum bulk, complexity and weight.

Another object of the invention lies in the provision of an improved ferrimagnetically tunable Gunn oscillator capable of operating over an extremely wide band, and in which the tuning curve is substantially linear.

Yet another object of the invention lies in the provision of an improved ferrimagnetically tunable Gunn oscillator exhibiting a substantially linear power profile within predetermined frequency limits.

These objects, as well as other incidental ends and advantages, will more fully appear in the progress of the following disclosure, and be pointed out in the appended claims.

In the drawings, to which reference will be made in the specification, similar reference characters have been employed to designate corresponding parts throughout the several views.

TECHNICAL CONSIDERATIONS

Figure 1:
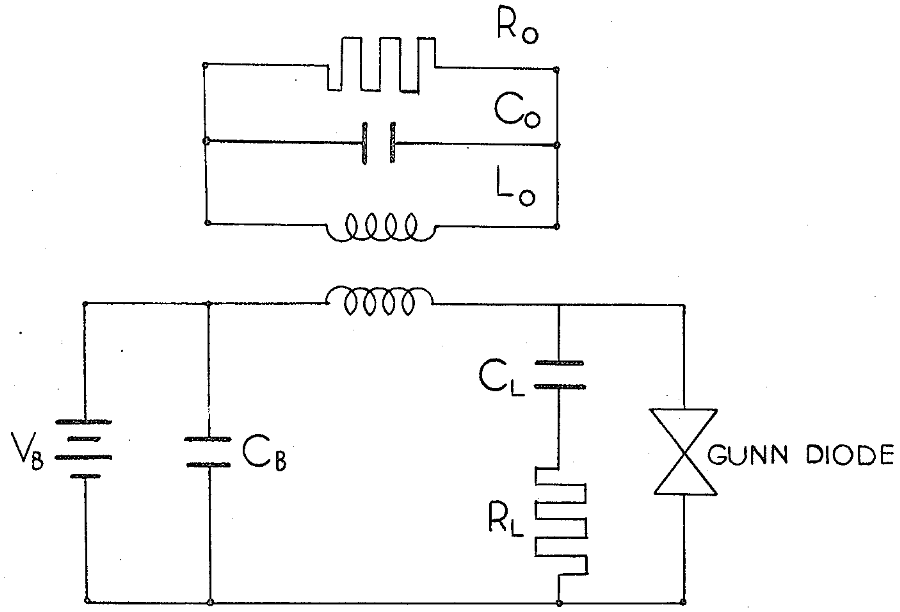
FIG. 1 is a schematic view of an equivalent circuit of a ferrimagnetically tunable Gunn oscillator, embodying the invention.

Before entering into a consideration of the structural aspects of the invention, a brief discussion of the theory involved is believed apposite.

The generation of microwave power from the current modulation which results from the motion of high electric field domains in GaAs, discovered by J. B. Gunn, is now reasonably well understood. At present, this phenomenon can provide microwave power in several different, distinct modes of oscillation [1]

[1] J. B. Gunn, "Effect of domain and circuit properties on oscillators in GaAs", IBM J. Research and Development, pp. 310–320, July 1966.

[2] J. A. Copeland, "A new mode of operation for bulk negative resistance oscillators", Proc. IEEE (Letters), vol. 54, pp. 1479–1480, October 1966.

[3] Ho-Chung Huang, "A Gunn diode operated in the hybrid mode," Technical Report No. RADC–TR–68–86, April, 1968.

The modes are classified according to the mechanism of domain extinction involved. Only three modes of operation have the potential of wide frequency tuning, namely, the transit time, the LSA, and the hybrid mode. Of the three modes, only the transit time mode of operation is considered herein.

The transit time mode is that in which a domain is nucleated at the cathode and travels to the anode where it is extinguished. A new domain is then nucleated immediately at the cathode. Simple analysis would lead one to believe that the output frequency depends solely on the separation between cathode and anode. This, however, is not true, if the semiconductor device is placed in a microwave circuit. The circuit is made to resonate by the current impulses which surge through as a domain collapses and forms again. As the circuit begins to resonate, electrical fields are generated within it at microwave frequencies. The microwave fields react on the device, so that the domain moves under the combined influence of the microwave field and the biasing direct current electric field. When the microwave field acts in a direction opposite that above the direct current field, the combined field falls below the threshold level, and the domain collapses. Under these circumstances, the frequency will be determined by the circuit resonant frequency rather than by the length of the device. It follows that the output frequency of the Gunn diode can be tuned over a wide frequency range by providing a variable external reactance which can change the circuit resonant frequency. In fact, computer calculations of the behavior in a resonant circuit of a Gunn diode have shown that the oscillation frequency can be shifted by 80 percent with the oscillator loaded for reasonable output efficiency. The feasibility of tuning the transit time Gunn effect oscillator has been proven by a number of various techniques, such as a mechanically tunable microwave cavity [4]

[4] D. P. Brady, S. Knight, K. L. Lawley, and M. Uenohara, "Recent results with epitaxial GaAs Gunn effect oscillators", Proc. IEEE (Letters), vol. 54, pp. 1497–1498, October 1966, a varactor.

[5] G. E. Brehm and S. Mao, "Varactor-tuned integrated Gunn oscillators", presented at the 1968 International Solid-State Circuits Conf., Philadelphia, Pa.

[6] D. Zierger, "Frequency modulation of a Gunn effect oscillator by magnetic tuning", Electronics Lett., vol. 3, pp. 324–325, July 1967.

[7] N. S. Chang, T. Hayamizu, and Y. Matsuo, "YIG-tuned Gunn effect oscillator", Proc. IEEE (Letters), vol. 55, p. 1621, September, 1967.

The reported tuning capability of all of these techniques, with the exception of the mechanically tunable cavity was very limited.

In the disclosed embodiment, by the use of a ferrimagnetic resonator as a tuning element, and the particular circuit employed, I have been able to obtain a very wide frequency tuning (more than octave) Gunn effect oscillator. The use of this resonator to control the frequency is attractive, because the element possesses wide tuning ranges, linearity of tuning, and high unloaded Q.

Reference may now be made to FIG. 1 in the accompanying drawings, in which the complete circuit employed to accomplish the above mentioned wide tuning is shown in FIG. 1. The various parameters in the circuit are defined as:

a. Ro, Co, and Lo represent the ferrimagnetic resonator.

b. $C\beta$ is an RF bypass capacitor.

c. $R_L$, and $C_L$ represent the load where $C_L$ is used for optimizing power output.

Figure 2:
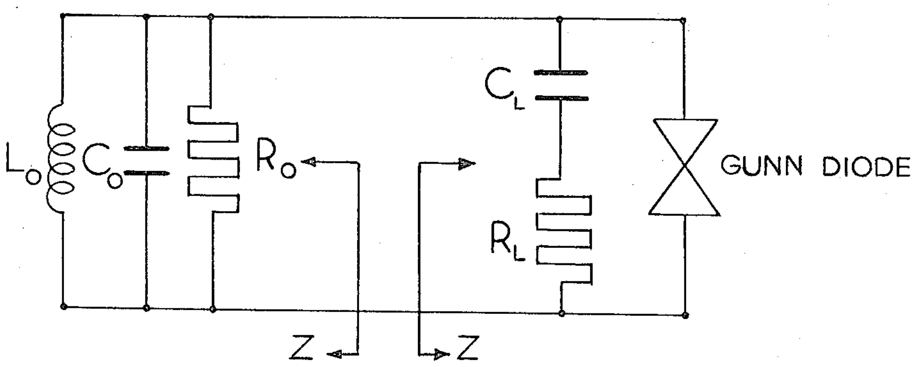
FIG. 2 is a schematic view of an RF equivalent circuit of a ferrimagnetically tunable Gunn oscillator, embodying the invention.

To understand the application of the ferrimagnetic resonator as an oscillator tuning element, consider the simplified RF oscillator circuit shown in FIG. 2. Circuit theory asserts that, for any stable oscillating system, (1) $\overrightarrow{Z}+\overleftarrow{Z}=0$ where: $\overrightarrow{Z}$ = the input impedance to the right of the reference, and $\overleftarrow{Z}$ = the input impedance to the left of the reference.

This means that both the imaginary and the real parts must independently be zero. The equation for the imaginary part determines the oscillation frequency and that for the real part determines the amplitude of the oscillation. The equation for the real part also shows that the magnitude of the real part of the diode impedance is equal to that of the circuit.

Figure 3:
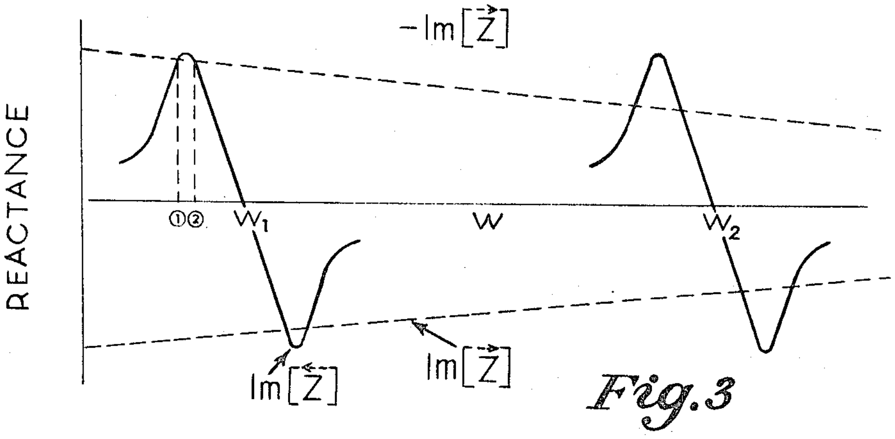
FIG. 3 is a graph showing frequency vs. reactance.

To focus on several very interesting characteristics of the ferrimagnetic resonator used as a tuning element, reference may be made to a plot of the imaginary part of both $\overrightarrow{Z}$ and $\overleftarrow{Z}$, as shown in FIG. 3. In this FIG, $Im[\overleftarrow{Z}]$ is plotted only for two different resonant frequencies. From this plot a number of observations can be made, i.e., a. The resonator can provide a net inductive or capacitive reactance away from resonance.

b. The resonator has to provide a reactance which is equal and conjugate to that of $Im[\overrightarrow{Z}]$ over the entire frequency range of interest. One variable usable in acquiring the desired reactance is to change the degree of coupling to the resonator. However, to the excitation of magnetostatic modes which may generate spurious oscillation, the degree of tight couplings is limited.

If the conditions are such that the resonator cannot provide the required reactance without excessive coupling, then a length of transmission line may be used between the resonator and the $\overrightarrow{Z}$ as a transformer.

c. At a given resonant frequency, $w$, the resonator provides the proper reactance at two different frequencies, as at points 1 and 2 in FIG. 3. However, based on gain considerations, the resultant oscillating frequency will be determined by the reactance corresponding to a lower equivalent series resistance (point 1).

Due to the complex dependency of $Im[\overrightarrow{Z}]$ on frequency, the oscillator tuning linearity and the rate of change of frequency vs. magnetic field will be different from that of the ferrimagnetic resonator. This property of the tuning element may present a problem when the oscillator is used in a receiver with an extremely narrow band ferrimagnetic resonator preselector.

At microwave frequencies, it is necessary to use some form of transmission line for circuit interconnection. As is common with integrated microwave circuits, microstrip transmission line is employed, with the added advantage of greater mechanical convenience in use, than any other type of transmission line commonly used.

The application of the ferrimagnetic resonator as a tuning element involves selection of the proper material and appropriate coupling mechanism for operation over the desired frequency range. In the case of the instant embodiment, YIG is most appropriate.

Coupling to a spherical ferrimagnetic resonator can be achieved by locating the sphere in a region of strong RF magnetic field such as occurs near the inner conductor of the coaxial, strip or microstrip transmission line. The coupling can be further enhanced by concentrating the RF magnetic field in the vicinity of the sphere with a short circuit on the transmission line. In the disclosed embodiment, utilization is made of both coupling techniques.

Figure 4:
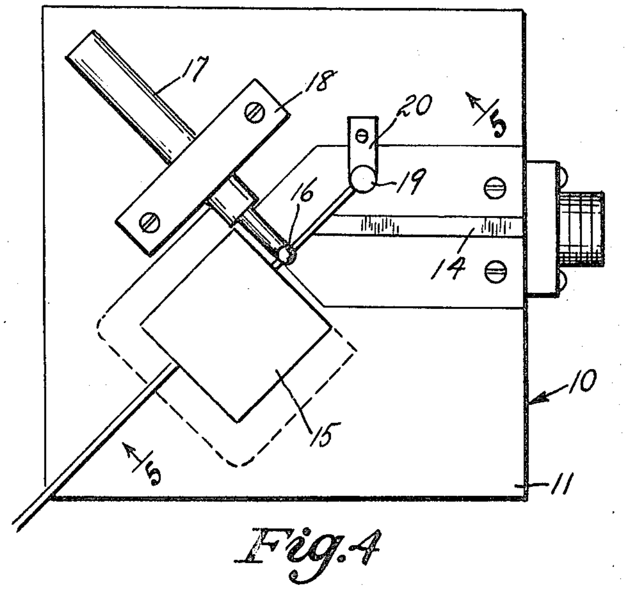
FIG. 4 is a plan view of an embodiment of the invention.
Figure 5:
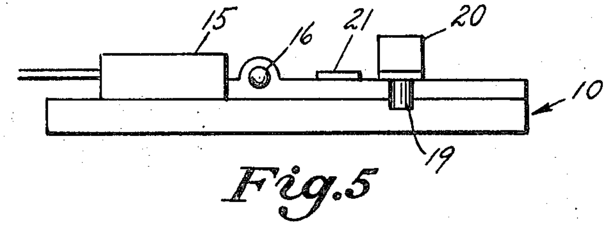
FIG. 5 is a sectional view thereof as seen from the plane 5–5 in FIG. 4.
Figure 8:
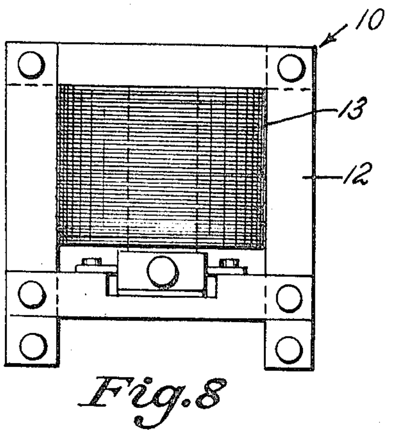
FIG. 8 is a view in elevation of a fully assembled embodiment.

With the foregoing discussion in mind, reference may now be made to FIGS. 4, 5 and 8 wherein a preferred embodiment of the invention is illustrated. In accordance therewith, the device, generally indicated by reference character 10, comprises broadly: an oscillation plate element 11, a frame element 12 and an electromagnet element 13.

The oscillator is constructed on a polytetrafluoroethylene dielectric microstrip transmission line 14. The bias voltage for the Gunn diode is brought in through a parallel plate bypass capacitor 15. The capacitor is preferably made from a 1 mil thick polyester dielectric tape between the microstrip ground plane and a 0.200 inch by 0.200 inch by 0.060 brass plate (not shown). To assure temperature stability, the capacitor is held down by a suitable bonding agent. The magnitude of capacitance as measured by a low frequency bridge is 25 pf.

The ferrimagnetic resonator 16 is a YIG sphere of 0.0284 inch diameter and 0.250 $e$ in line width. The sphere is preferably mounted on a dielectric rod 17, the rod in turn being mounted in a polytetrafluoroethylene block 18, which construction allows for a smooth rotation of the sphere which is necessary for oscillator temperature stability.

The length of transmission line 14 between the Gunn diode 19 and the bypass capacitor 15 is made up of two parts. The section over the ferrimagnetic resonator 16 has a characteristic impedance ($Zo$) of 230 ohms, and the remaining section a characteristic impedance of 120 ohms. The overall length is 0.187 inch. This length of transmission line serves as an impedance transformer between the diode and the bypass capacitor.

The diode 19 is a TI–189B type in a P-type package. It is preferably mounted with the flange upwardly, in order to provide an adequate heat sink. The diode is also recessed by 0.020 inch into the microstrip ground plane for the purpose of reducing the gap on the electromagnet. The junction of the diode and the transmission line joining the diode with the bypass capacitor is held by a glass epoxy dielectric holder 20.

The output capacitor 21, $C_L$ used for optimizing output power, may be made from a 1-mil polyester dielectric tape between overlapping copper strips. The overlapping copper strips are part of the 120 ohm and 50 ohm characteristic impedances of the output line 22.

The electromagnet 13 includes a core made of satmumetal. This material is particularly suitable due to its high intrinsic saturation field (15 K gauss). The electromagnet gap is 0.200 inch, which the minimum for this microstrip design. A stripline oscillator design would permit a somewhat smaller gap. Similarly, a smaller electromagnet gap can be realized with a microstrip transmission line oscillator design if a chip form diode, and a discoidal rather than a spheroidal resonator is used.

PERFORMANCE CHARACTERISTICS

Figure 6:
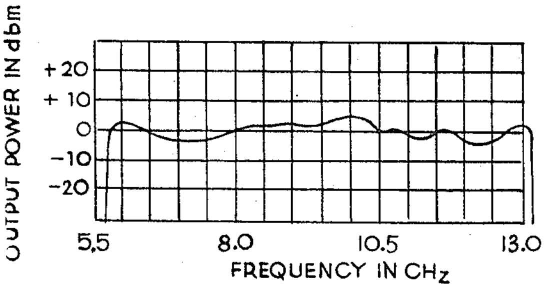
FIG. 6 is a graphic representation of a power profile of the disclosed embodiment.
Figure 7:
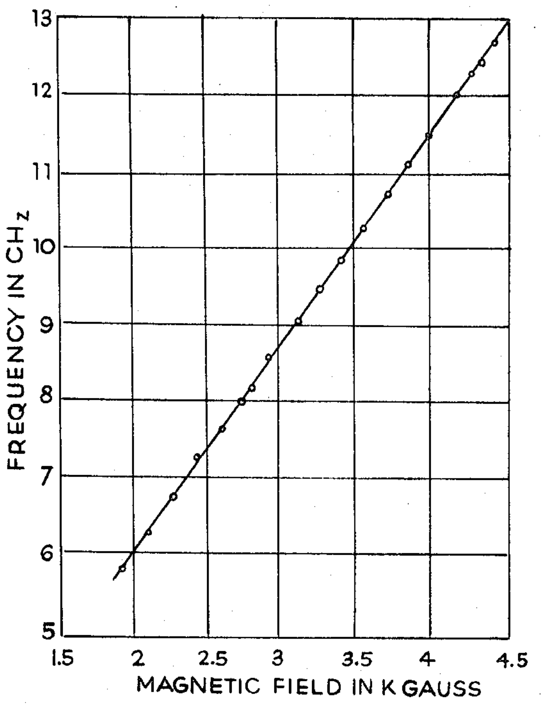
FIG. 7 is a graphic representation of the tuning curve of the disclosed embodiment.

With the Gunn diode biased at twice the threshold voltage, the power profile and the tuning curve of frequency vs. magnetic field were measured with the results shown in FIGS. 6 and 7, respectively. The tuning linearity of the oscillator ranged from ± 0.125 to ± 0.50 percent, depending upon the diode used.

The oscillator has also performed well at an ambient temperature of 105° C. Frequency drift of 2.3 MHz per degree Centigrade was observed.

During the development of this oscillator, a number of interesting performance characteristics have been noted:

a. There is a power profile hysterises, i.e. the output power is different when tuning the oscillator up or down;

b. The oscillator is sensitive to the polarity of the DC magnetic field;

c. The oscillator has exhibited a tuning range shrinkage with increasing ambient temperature; and d. The oscillator is capable of operating at two frequencies at the same time. One frequency depends on the ferrimagnetic resonator, while the other is the transit time frequency of the diode. Due to the nonlinear behavior of the diode, the two frequencies mix and generate sum, differences and their harmonics. This phenomena does not take place over the entire tuning range. However, where it does take place, the oscillator is generating spurious frequencies. To partially overcome this problem, the oscillator output may be modified to include a ferrimagnetic resonator preselector (not shown). The entire assembly, when placed on to the same electromagnet, functions well. The spurious frequencies are reduced by the amount of preselector isolation.

It should be mentioned that with better quality diodes, such as TI–L–189D, the above phenomena does not take place.

I wish it to be understood that I do not consider the invention limited to the precise details of structure shown and set forth in this specification, for obvious modifications will occur to those skilled in the art to which the invention pertains.

I claim:

1. A ferrimagnetically tuned Gunn effect oscillator comprising:

a Gunn-type diode, a ferrimagnetic resonator, means providing a variable magnetic field passing through said ferrimagnetic resonator, and a length of transmission line interconnecting said diode and said ferrimagnetic resonator.

2. Structure in accordance with claim 1, including a bypass capacitor supplying bias voltage for said diode.

3. Structure in accordance with claim 1, in which said length of transmission line is of microstrip type.

4. Structure in accordance with claim 1, in which said ferrimagnetic resonator is in the form of a YIG sphere.